(12) United States Patent
Malmberg (10) Patent No.: US 6,780,043 B2
(45) Date of Patent: Aug. 24, 2004

(54) GUIDE AND SUPPORT STRUCTURE

(75) Inventor: Karl Gunnar Malmberg, Haninge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/450,163

(22) PCT Filed: Dec. 12, 2001

(86) PCT No.: PCT/SE01/02747

§ 371 (c)(1),
(2), (4) Date: Jun. 11, 2003

(87) PCT Pub. No.: WO02/51219

PCT Pub. Date: Jun. 27, 2002

(65) Prior Publication Data

US 2004/0048517 A1 Mar. 11, 2004

(30) Foreign Application Priority Data

Dec. 20, 2000 (SE) ............................................. 0004737

(51) Int. Cl.[7] .............................................. H01R 13/64
(52) U.S. Cl. ........................ 439/377; 439/64; 361/756; 361/802
(58) Field of Search ........................... 439/377, 64, 61, 439/62, 205, 206, 485; 361/756, 802

(56) References Cited

U.S. PATENT DOCUMENTS

| | | | |
|---|---|---|---|
| 3,258,650 A | | 6/1966 | Fiege |
| 4,007,403 A | | 2/1977 | Fiege |
| 5,191,514 A | * | 3/1993 | Kabat et al. ................. 361/802 |
| 5,467,254 A | * | 11/1995 | Brusati et al. .............. 361/799 |
| 5,696,668 A | * | 12/1997 | Zenitani et al. ............. 361/802 |
| 5,805,429 A | | 9/1998 | Andersson |
| 5,923,532 A | * | 7/1999 | Nedved ....................... 361/690 |
| 6,269,006 B1 | * | 7/2001 | Treiber et al. .............. 361/756 |
| 6,442,035 B1 | * | 8/2002 | Perry et al. ................. 361/756 |

FOREIGN PATENT DOCUMENTS

GB    1 554 506 A    10/1979

* cited by examiner

Primary Examiner—P. Austin Bradley
Assistant Examiner—X. Chung-Trans
(74) Attorney, Agent, or Firm—Nixon & Vanderhye, P.C.

(57) ABSTRACT

The invention relates to a guide and support structure (1) that in addition to providing a secure and stable guide support for the plug-in unit and good electric contact properties enhances the removal of heat from the plug-in unit. This is achieved by means of a guide and support structure having an upper web forming a guide channel for a plug-in unit and being connected to a base of the structure through side walls of the structure. The base is at least partially open in order to allow air flow through the interior of the elongated profile. By virtue of such a configuration blockage of a cooling-air flow will be significantly reduced. Such a reduced blockage of cooling-air flow will in turn enhance the cooling of plug-in units and will require less powerful fans for producing the cooling-air flow.

17 Claims, 9 Drawing Sheets

GUIDE AND SUPPORT STRUCTURE

This application is a continuation of international application PCT/SE01/02747 filed Dec. 12, 2001 which designates the U.S.

TECHNICAL FIELD

The present invention relates generally to a structure for supporting electronic component carriers, such as printed circuit cards, in a chassis, such as an enclosure.

BACKGROUND

It has been common practice for many years to mount printed circuit boards or cards in enclosures as so called plug-in units that may be easily inserted into and/or removed from the enclosure for replacement or repair. Conventionally, the plug-in units are slidably received in guide and support structures that are commonly named board guides or board rails. The main purpose of the board guide is to securely guide the plug-in unit into position in the enclosure, so that it may be connected to the backplane of the enclosure. In its simplest form, the conventional board guide typically consists of a molded guide channel manufactured from a non-conductive material and having integrally formed attachment means.

However, for most applications board guides are presently required to establish electrical contact between a conductive pattern or layer on the printed circuit board or card and a wall of a conductive enclosure. Such electrical contact or connection may be required both for the purpose of employing the enclosure as ground for the operation of the separate circuit boards and/or electronic components carried thereon and for the purpose of eliminating or at least minimizing electromechanical radiation emanating from the boards or cards.

Several attempts have been made to develop board guide structures that will meet the requirements for establishing an electrical connection between the circuit boards and the enclosure. Typically, such further developed board guides have a composite structure consisting of a solid channel member accommodating a separate contact and/or guide member. The solid channel member is normally molded or extruded from a synthetic resin material and accommodates a contact and/or guide member having several board contact spring fingers formed of a conductive metal. The contact and/or guide member is also provided with integral enclosure contact means extending through openings in the channel member to contact the enclosure. In other arrangements the channel member is formed of a thermally conductive material, such as aluminum, in order to promote heat transfer from the circuit board.

Examples of such prior art composite board guides are disclosed in U.S. Pat. Nos. 5,187,648, 5, 805,429 and 5,533,631.

U.S. Pat. No. 4,007,403 discloses a board guide that is formed as an integral unit of for instance stainless steel. Accordingly, this board guide eliminates some of the above discussed disadvantages. On the other hand, it comprises very few board contact points, which means that a reliable electrical contact with an inserted circuit board cannot be guaranteed.

In the board guides of the above discussed general designs it is difficult to provide a reliable electrical contact between the board and the enclosure and to maintain such contact during the useful life of the board guide. For the composite design, the reason for this is mainly the separate channel members and contact members. Specifically, the channel member is typically attached to the enclosure and the enclosure contact means of the guide and/or contact member are clamped between the channel member and the enclosure by said attachment. This means that cold flow or aging of the channel member material will directly affect the electrical connection that is basically also rather unreliable due to the fact that the contact is established only at the individual contact points of the board contact fingers and of the enclosure contact means. In this regard, the board guide design disclosed in U.S. Pat. No. 4,007,403 is even more unreliable. Here, the electrical contact between the board and the enclosure is restricted to the attachment means at the two ends of the structure, leaving the entire middle area of the structure free of any positive attachment to a supporting enclosure.

For the same reason the heat transfer capacity of the conventional board guide designs is quite limited, especially where the channel member consists of a resin material. In such board guides, the transfer of heat from the circuit board is restricted mainly to the limited contact points of the guide and/or contact member. Even in the above mentioned structures where the channel member is formed as an extruded aluminum profile or as an integral unit of stainless steel, the transfer of heat from the board to the channel member is restricted by the limited contact points. In the composite design heat transfer is also restricted even further by the often casual transfer from the guide and/or contact member to the channel member.

Furthermore, the conventional board guides cause additional problems in applications involving air-cooled enclosures. In such applications, cooling air flows through perforations in the enclosure walls to remove heat from the mounted circuit boards. In the above discussed conventional board guides a considerable portion of the flow of cooling air is effectively blocked by the guide structures having a rigid base forming or supporting the channel or channel member, respectively. The composite structure with the solid channel member as well as the integral guide structure of U.S. Pat. No. 4,007,403, are also both comparatively wide, so that they cover and thus block a relatively large number of perforations. In view thereof, the use of such board guide designs necessitates the use of more powerful fans to produce the required cooling-air flow through the walls of the enclosure.

SUMMARY

The invention overcomes the above problems in an efficient and satisfactory manner.

A general object of the invention is to provide a solution to the problem of providing an effective guide and support structure for a plug-in unit that is intended for slidable insertion into a chassis.

In particular, it is an object of the invention to provide an improved guide and support structure that enhances the removal of heat from an inserted plug-in unit, in addition to maintaining a secure and stable guide and support for the plug-in unit and good electric contact properties.

Briefly, this is achieved by means of a guide and support structure having an upper web forming a guide channel for a plug-in unit. Through side walls of the structure, the upper web is connected to a base of the structure. With such a configuration the guide and support structure will be slim and will basically not cause any unnecessary blockage of a cooling-air flow in a supporting chassis. Moreover, the base is at least partially open in order to allow air flow through the interior of the structure. Such a partly open design of the base will additionally reduce blockage of the cooling-air flow. This reduction of the blockage of cooling-air flow will in turn enhance the cooling of the plug-in units and will require less powerful fans for producing the cooling-air flow.

In an embodiment of the invention, the guide and support structure is formed as an integral unit from an electrically as well as thermally conductive metallic plate material. The metallic plate material will not only provide the appropriate support and guide for the plug-in unit, but will also secure good electrical contact throughout the useful life of the structure.

In another embodiment of the invention, the base of the guide and support structure has means for fixing the structure against the chassis as well as means for establishing electrical contact with the chassis. With such a configuration, good electric contact will be established both with regard to the chassis and to the plug-in unit.

In another embodiment of the invention the guide and support structure is configured as an elongated profile having a base forming means for conducting heat from a plug-in unit to the chassis. By virtue of the metallic material, the guide and support structure will also act as an effective heat sink.

In a practical embodiment the base of the guide and support structure is formed by free edges of the side walls, said free edges serving to support the structure against a chassis wall and to fix the structure to said wall as well as to provide the desired electrical and heat conducting contact therewith. Leaving the entire space between the side wall edges open will provide maximum cooling-air flow into the interior of the profile.

In a further embodiment of the invention the pressure drop of the cooling air flow caused by the guide and support structures of a chassis is reduced even further by providing apertures in at least one of the side walls of the elongated profile, said apertures serving to form a path for the cooling-air flow from the interior of the elongated profile to the interior of the chassis.

In other embodiments of the invention the guide and support structure is designed to provide a particularly secure guiding of the plug-in unit into position and a particularly firm support of said plug-in unit in a fixed position, and to provide a particularly effective electrical contact between the plug-in unit and the guide and support structure.

In further embodiments of the invention, the guide and support structure is designed to provide possibilities for a rational manufacturing of the integral guide and support structure, and to provide a secure attachment of the entire guide and support structure to a chassis wall.

These and further objects of the invention are met by the invention as defined in the appended patent claims.

In summary, the present invention provides the following advantages over the state of the art:

A good electrical contact will be maintained at all times; thereby

Securing a reliable grounding of the plug-in unit; and

An effective shield against electromagnetic radiation;

The guide and support structure will secure an effective conduction of heat from the plug-in unit, acting as a heat sink;

The guide and support structure causes minimum blockage of a cooling air flow, thereby further enhancing cooling of the plug-in unit;

The plug-in unit will be securely guided and supported in the structure;

The support unit is extremely easy to handle and to mount, consisting of only one unitary piece.

Other advantages offered by the present invention will be readily appreciated upon reading the below detailed description of embodiments of the invention.

BRIEF DESCRIPTION OF THE DRAWINGS

The invention, together with further objects and advantages thereof, may best be understood by making reference to the following description taken together with the accompanying drawings, in which.

DETAILED DESCRIPTION OF EMBODIMENTS

The invention will be described below with reference to the drawing figures that illustrate embodiments thereof adapted for use in supporting plug-in type PCB boards in a rack or sub-rack, such as in a telecommunications cabinet or magazine. However, it shall be understood that the invention is not restricted to this exemplifying embodiment or to such an application. The basic principles of the invention may likewise be applied in association with guide and support structures for other carriers of electronic components and of the plug-in type.

Such alternative applications will cover any electronic component carrier of the plug-in unit type, such as printed circuit cards and electronic modules, supported in an enclosure that may be referred to as a chassis, a cage or a rack and that accommodates an optional number of such carriers. Therefore, modifications and variations of the invention that may be required in such applications fall within the scope of the invention.

Figure 1:
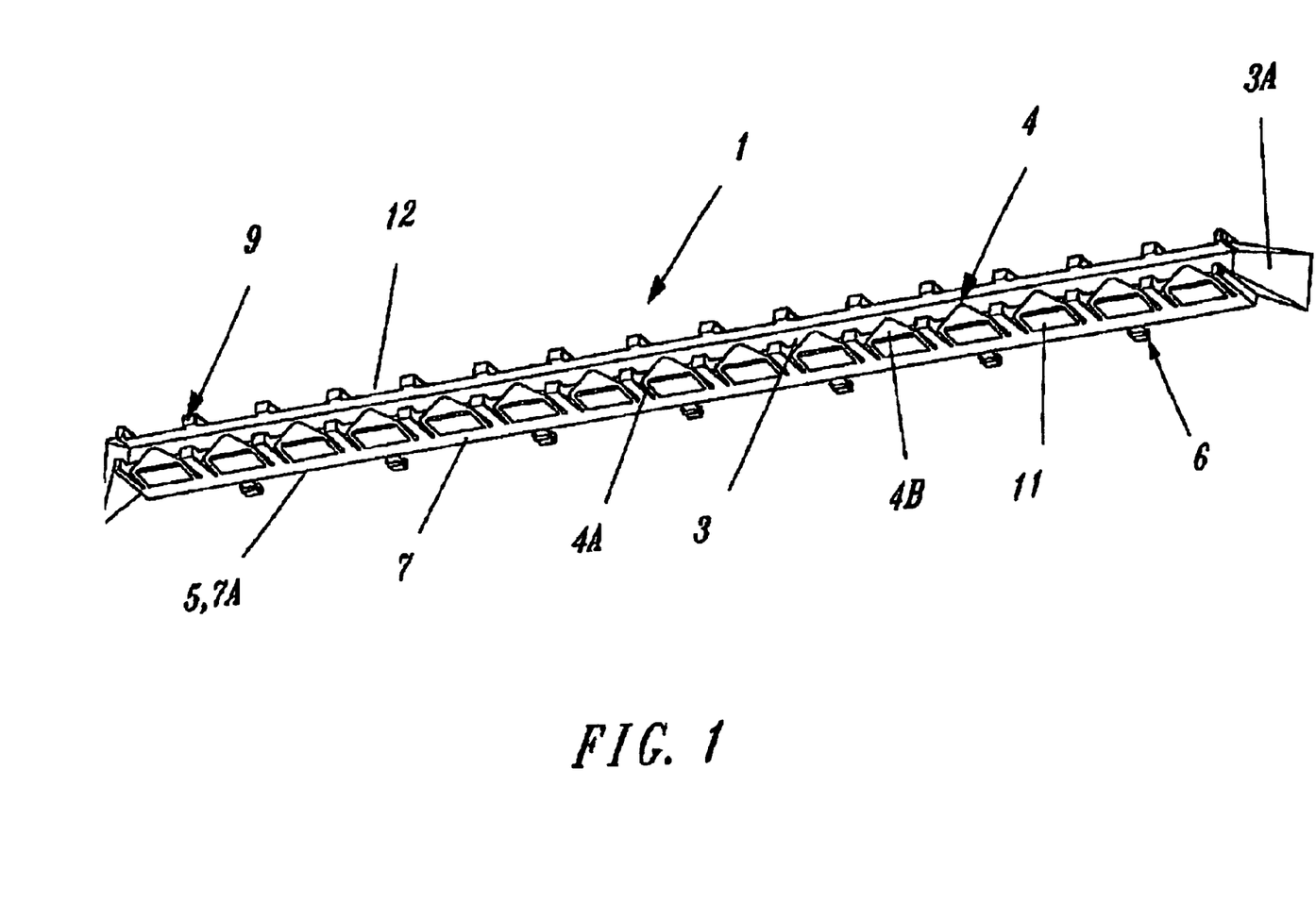
FIG. 1 is a top perspective view of a first embodiment of a guide and support structure according to the invention.
Figure 2A:
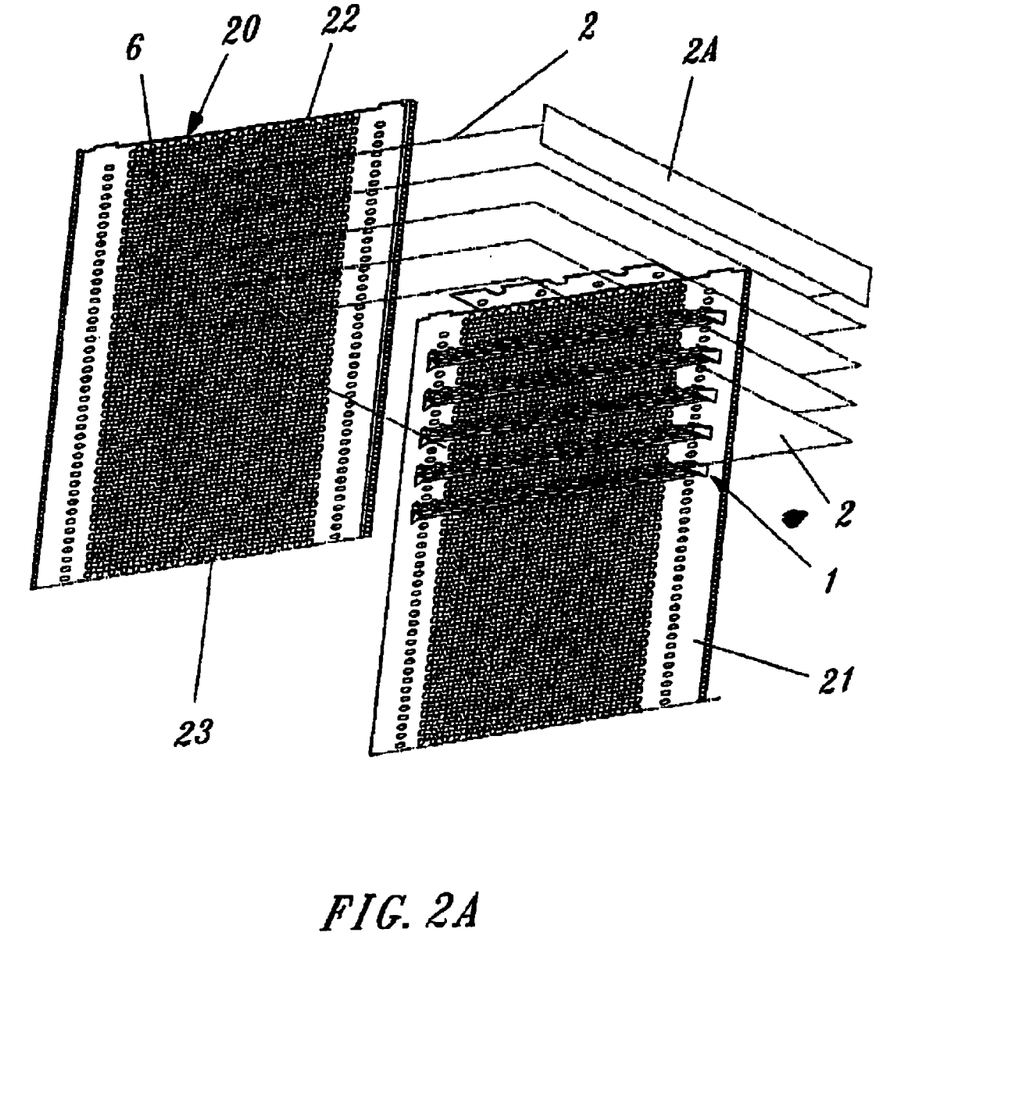
FIG. 2A is a partial perspective view of guide and support structures according to FIG. 1 attached to a schematically illustrated chassis and guiding and supporting schematically illustrated plug-in units.
Figure 2B:
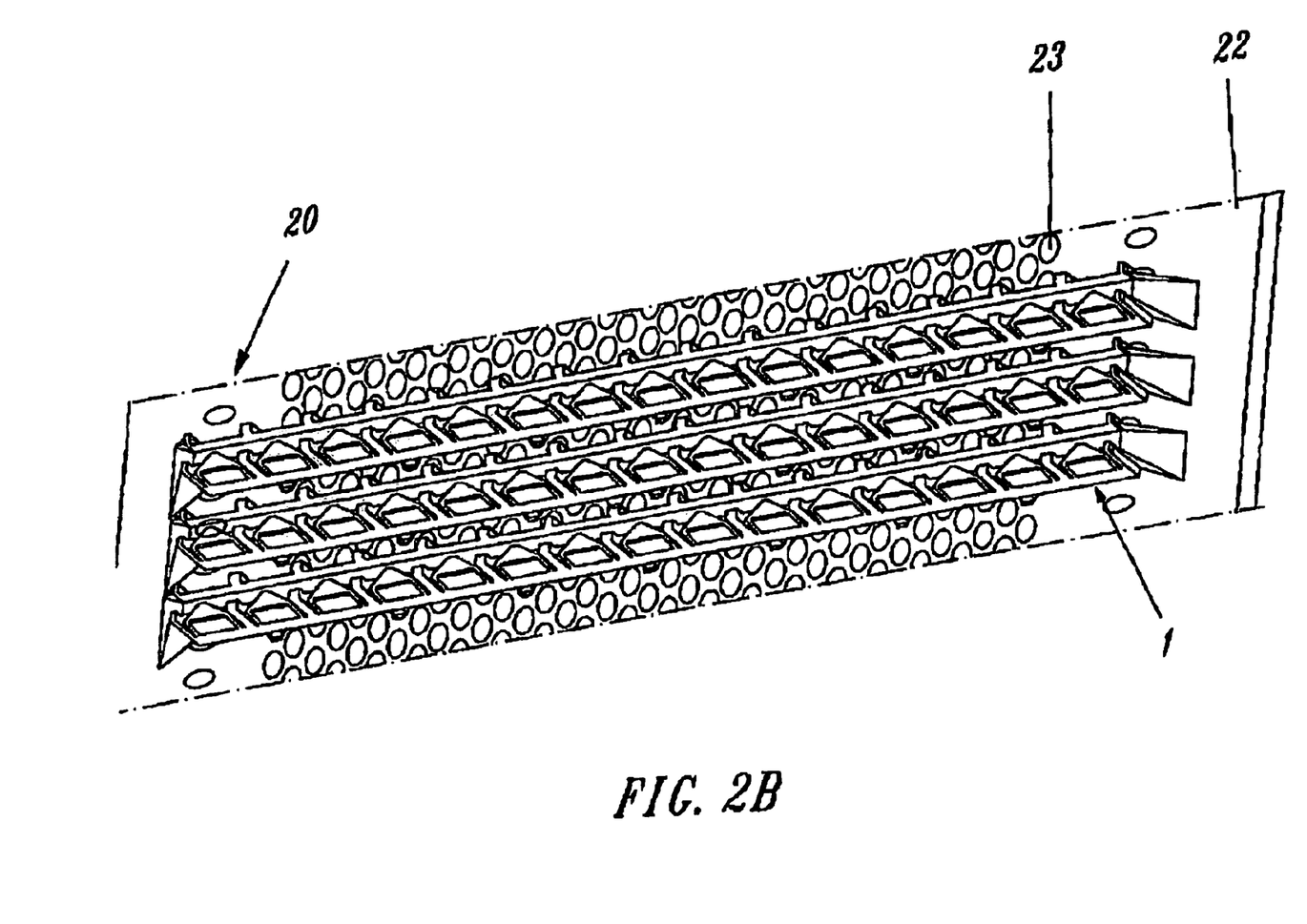
FIG. 2B is an enlarged view of a detail of the chassis illustrated in FIG. 2A, illustrating a slightly modified assembly of the guide and support structures.
Figure 3:
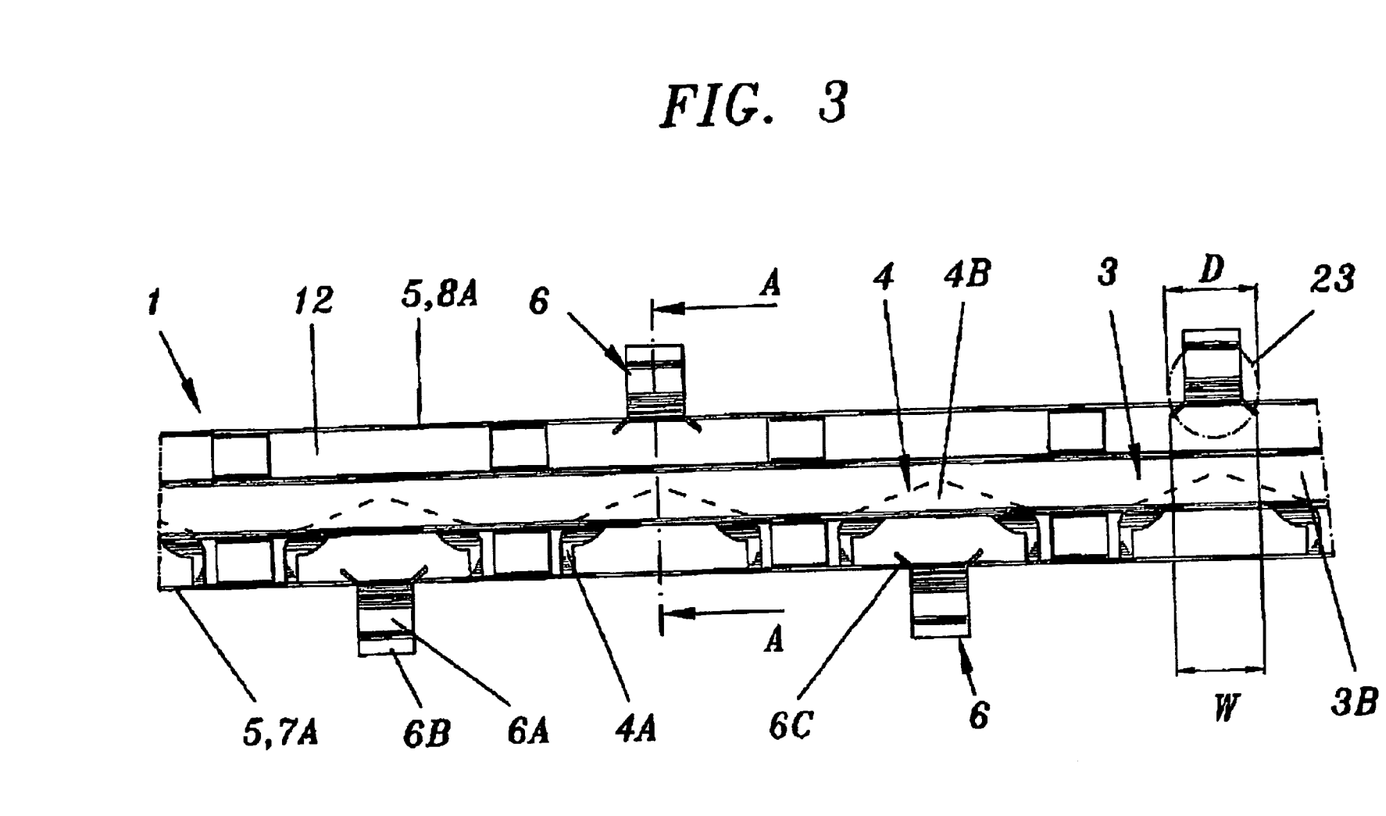
FIG. 3 is a bottom plan view of the guide and support structure as illustrated in FIG. 1.

A first embodiment of the invention will now be described with specific reference to drawing FIGS. 1–5. FIGS. 1, 3, 4A–B and 5A–B illustrate a presently preferred embodiment of the inventive guide and support structure 1 for plug-in cards or boards, whereas FIGS. 2A and 2B illustrate the inventive guide and support structure in a typical application for supporting plug-in units 2 in a sub-rack 20.

According to the invention, the guide and support structure 1, or board guide, is formed as a generally U-shaped (see FIGS. 4A and 4B) elongated profile that is manufactured as an intgral unit from a metallic plate material having good electrical as well as thermal conductivity. A presently preferred material is a tin-plated stainless steel grade, but other metal plate materials having the appropriate properties may likewise be employed.

The elongated profile 1 consists of two spaced but substantially parallel first and second profile side walls 7, 8 respectively that are interconnected at one end by an upper web portion 9, where "upper" refers to its positioning, in the attached condition, with regard to the wall 21 or 22 of the sub-rack or chassis 20. The opposite or lower ends or free edges 7A, 8A of the side walls 7, 8 form a base portion 5 of the guide and support structure 1 (se especially FIGS. 5A and 5B). The base portion is completely open between the free edges 7A, 8A and is intended to be supported against a side wall 21 or 22 of the sub-rack 20 in the attached condition.

A guide channel 3 is formed in the upper web portion 9 of the profile 1, said guide channel likewise having a general U-shape, but being directed with its open side facing away from the base portion 5 of the profile 1. The guide channel 3 serves the main purpose of securely guiding a plug-in unit 2 during insertion and of supporting the inserted unit 2 in a fixed position. In order to facilitate the initial insertion of a plug-in unit, an insertion ramp 3A is provided at the entrance to the guide channel 3, said ramp having an inclined surface and outwardly diverging side walls. In fact, an insertion ramp 3A is provided at each end of the guide channel 3, so that a plug-in unit 2 may be inserted from either end thereof. This adds to the flexibility of the guide and support structure, since it may be attached to a chassis in two inverted positions. Furthermore, the appropriate guide and support for a plug-in unit in the guide channel 3 is achieved by providing a continuos rigid bottom wall 3B and likewise rigid first and second channel side walls 3C and 3D, respectively. Said channel side walls 3C, 3D are continues, that is uninterrupted, over at least an essential portion of their height (see especially FIGS. 4A, 5A and 5B). The second channel side wall 3D has a larger uninterrupted height than the first channel side wall 3C, for reasons that will be explained further below.

A series of individual contact members 4 are formed in the first profile side wall 7, evenly distributed along the length of the profile. To be precise, the individual contact members 4 consist of a base portion 4A and a contact portion 4B. The base portion 4A is formed basically from the plate material of said first profile side wall 7. The contact portion 4B is formed basically from the material of the web portion 9, which results in the above mentioned reduced uninterrupted height of the corresponding first channel side wall 3C. The contact portion 4B has a tapered and slightly rounded outer free end to allow insertion of a plug-in unit, as will be discussed below. In the illustrated embodiment, the base portion 4A of the contact members 4 is provided with a central first side wall aperture 11 serving as a cooling-air exit, as will likewise be discussed further below. This means that each base portion 4A actually consists of two spaced support legs 4A together supporting a contact portion 4B. Each support leg 4A is bent inwardly towards the guide channel 3 at a position 4C adjacent their connections to the remaining first profile side wall 7. Thereby the contact portion 4B is positioned at the proper position above the open side of the guide channel 3 (FIGS. 4A and 4B), that is extending into the path of movement of an inserted plug-in unit.

Second side wall apertures 12 are provided in the second profile side wall 8 and partly in the upper web 9, likewise serving as the later discussed cooling-air exits. The second side wall apertures 12 that are formed in the second profile side wall 8 are wider in the longitudinal direction of the profile 1 than the first side wall apertures 11 formed in the first profile side wall 7. On the other hand, the first side wall apertures 11 extend further down towards the base portion 5. In essence, the cooling-air exit area provided by the second side wall apertures 12 approximately equals the combined cooling-air exit area provided by the first side wall apertures 11 and the open area surrounding the contact members 4.

Figure 4A:
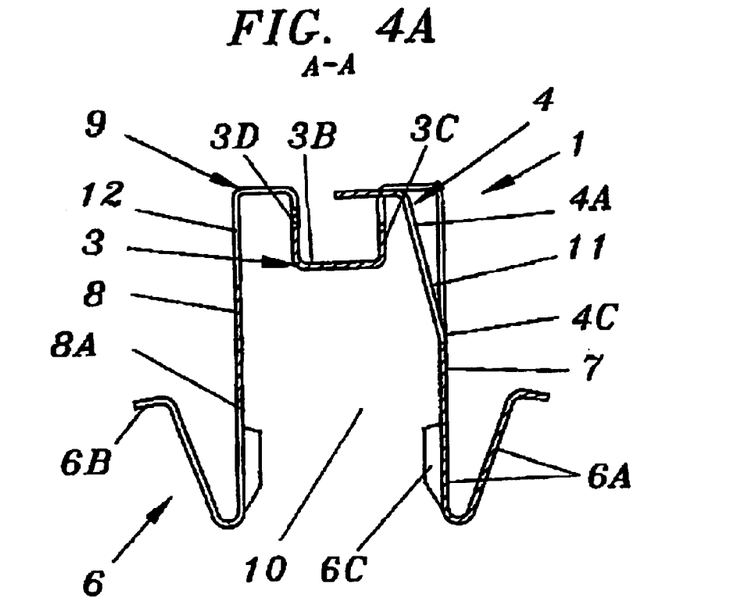
FIG. 4A is a cross section through the guide and support structure illustrated in FIGS. 1 and 3, taken along the line A—A of FIG. 3.
Figure 4B:
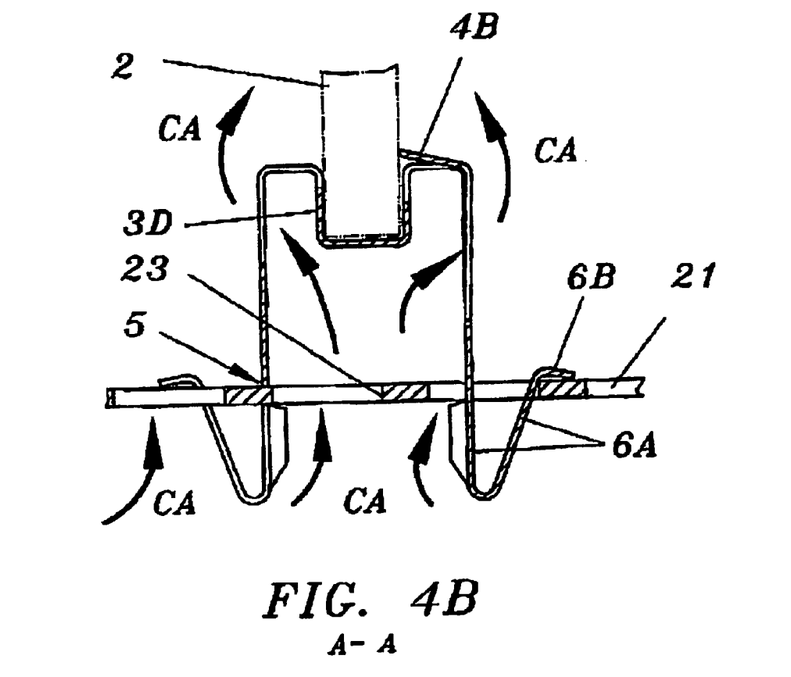
FIG. 4B is a cross section corresponding to that of FIG. 4A, illustrating the attachment of the guide and support structure to a chassis wall and also schematically illustrating a carrier inserted into the guide channel of the guide and support structure.
Figure 5A:
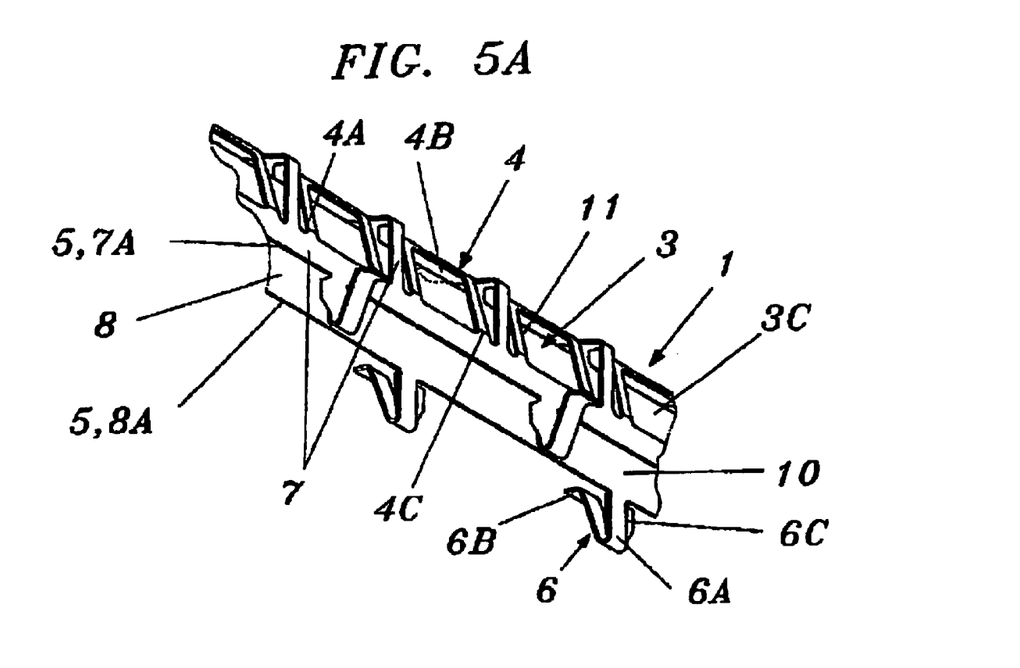
FIG. 5A is a partial bottom perspective view from one side of the first embodiment of the guide and support structure.
Figure 5B:
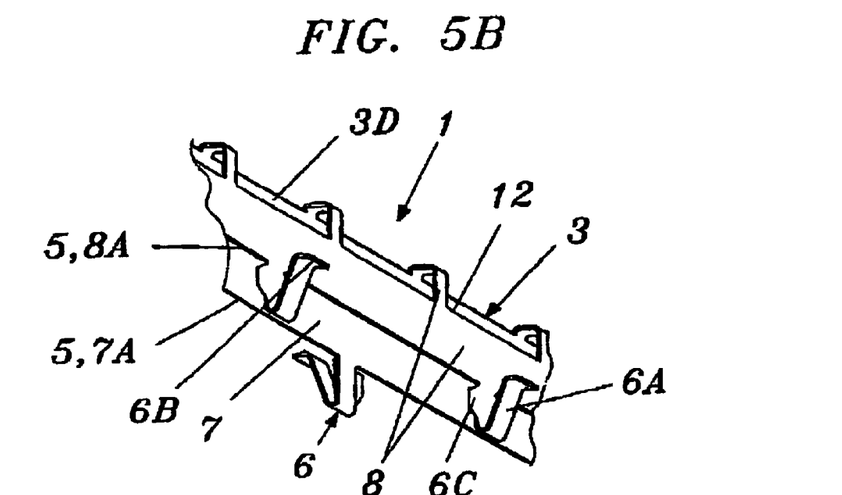
FIG. 5B is a partial bottom perspective view from the opposite side of the first embodiment of the guide and support structure.

At the base portion 5 of the profile 1, each one of the free edges 7A, 8A of the side walls 7, 8 is provided with a number of locking tabs 6 that are formed integral with the side walls and that protrude downwardly therefrom, as seen in the illustrations of FIGS. 4A and 4B. In the illustrated embodiment he locking tabs 6 are evenly distributed along each free edge 7A, 8A, with the locking tabs of one edge 7 being displaced with half a pitch along said edge in relation to the locking tabs of the other edge 8. Such an arrangement is presently regarded as providing the best distribution for obtaining a secure attachment to a sub-rack wall. However, other arrangements for the locking tabs 6 may provide an equally secure attachment and the invention shall therefore not be restricted to such a specific positioning of the locking tabs. In any specific practical application the arrangement of the locking tabs shall be adapted to the pattern of the perforations of the chassis wall, to ensure that in the correct position of the structure 1 all of the tabs 6 will fit properly into a corresponding perforation 23.

With specific reference to drawing FIGS. 4A–B and 5A–B, it will be seen that each locking tab 6 comprises a generally V-shaped main body 6A. A first portion of the main body extends downwardly from the lower edge of an associated side wall 7, 8 of the profile 1, substantially in the plane of said associated side wall. A second portion of the main body 6A is bent outwardly and then back towards the associated side wall, forming an acute angle with the first portion. A support lug 6B is formed at the free end of the second portion by bending said free end to lie substantially in a plane that is transversal to the plane of the associated side wall and that crosses said side wall at its lower free edge. In the mounted condition said support lug 6B is intended to engage an inner surface of a wall 21 or 22 of a chassis 20. Furthermore, pawls 6C are provided at each side of the first portion of the main body. Said pawls are intended to engage an outer surface of said wall 21 or 22 of the chassis 20 to thereby fix the guide and support structure 1 to said chassis wall.

It will be appreciated that with the above described design the inventive guide and support structure 1 may be manufactured in one piece in a very rational manner. In an initial step, the entire profile may be punched from a metallic plate material in one single punching operation. Specifically, the free edges 7A, 8A of the side walls 7, 8, the locking tabs 6, the individual contact members 4, the insertion ramps 3A and the first and second side apertures 11 and 12 may be formed in such an initial step. In subsequent bending operations, the U-shaped guide channel 3 is formed; the entire elongated profile 1 is given its general U-shape; and the insertion ramps 3A, the contact members 4 and the locking tabs are given their final shape.

FIG. 2A illustrates the use of the inventive guide and support structure 1 in a typical air-cooled chassis or sub-rack 20 that is schematically illustrated by means of two walls 21, 22 thereof. The walls 21, 22 are provided with evenly distributed perforations 23 that serve the double purpose of allowing cooling-air to enter the interior of the rack 20 to cool plug-in units 2 inserted therein and of maintaining an appropriate shield against electromagnetic radiation. The cooling-air flow is typically created by means of fans that are provided outside the sub-rack. This manner of providing a flow of cooling-air is conventional and will not be discussed in any detail, nor illustrated any further herein.

With reference to FIG. 2A, pairs of guide and support structures 1 are provided at the same level in the two walls 21 and 22, that is in the corresponding rows of the perforations 23. FIG. 2A illustrates the guide and support structures 1 that are attached to the wall 21 being positioned to the right in said drawing figure. It should be understood though, that guide and support structures 1 are attached in the same manner to the inner side of the wall 22 being positioned to the left in the drawing figure. Said further guide and support structures 1 are only vaguely visible in FIG. 2A, represented by the locking tabs 6 extending through the chassis 20 wall 22.

In order to attach the guide and support structures 1 to the chassis 20 walls 21, 22, the locking tabs 6 are introduced into the appropriate perforations 23 of the walls 21, 22. Specifically, the locking tabs are inserted with the point of the V-shape first, until the support lugs 6B engage the inner surface of the associated wall 21 or 22 and the pawls 6C have been extended through the perforations 23 so as to be in a position for engaging the outer surface of the wall. In this way, the chassis wall 21 will be clamped between the pawls 6C on the one hand and the support lugs 6B and the free edges 7A, 8A of the side walls 7, 8 on the other hand, as is clearly illustrated in FIGS. 3 and 4B. The distance W between the outer extremities of the two pawls 6C of each locking tab 6 slightly exceeds the diameter D of the perforations 23 (see FIG. 3). This means that the side walls and/or the locking tabs of the guide and support structure 1 shall be elastically deformed when inserting the locking tabs 6 into the perforations. Specifically, this is done to position the pawls 6C approximately at the diameter of the associated perforation, where they may be freely inserted. When the locking tabs 6 have been fully inserted, the side walls and/or locking tabs are released to allow them to spring back and to position the pawls in a position where they both engage the outer surface of the chassis wall and positively lock the guide and support structure 1 to the chassis wall. In order to automatize the attachment of the guide and support structures 1 the necessary force for providing the elastic deformation of the side walls and/or locking tabs is preferably applied by means of a special tool that is not part of the invention and that is not specifically disclosed herein.

Plug-in boards 2, normally having board fronts 2A, are then inserted into the chassis 20 by being slidably introduced into the guide channels 3 of the appropriate pairs of guide and support structures 1. The initial insertion is facilitated by the provision of the insertion ramps 3A. The further insertion of the plug-in boards 2 will be in a direction transversal to the individual contact members 4 that extend into the path of the plug-in board. Through the tapered and slightly rounded outer free end of the contact members 3, the insertion of the plug-in boards 2 will cause the contact members to be elastically deflected from said path of movement. With a plug-in board 2 fully inserted into a guide and support structure 1, all of the individual contact members 4 will therefore assist in biasing the board 2 against the second higher channel side wall 3D. A reliable electrical as well as thermal contact will be established between the board 2 and the combination of the plurality of individual contact members ands the rigid second channel side wall 3D having the larger uninterrupted height and therefore having a larger contact surface. The large surface area of the second channel side wall in combination with the continuos bottom channel wall 3B will also secure that the board 2 is properly guided and positioned in the guide and support structure 1.

Furthermore, the described configuration of the guide and support structure 1 provides for an effective and secure electrical as well as thermal contact between the base 5 of the profile 1 and the chassis 20 walls 21, 22. Specifically, the combination of the entire free ends 7A, 8A of the side walls 7, 8 and the locking tabs 6 form a large effective contact surface. It will be appreciated that a very effective grounding of the plug-in board 2 will be achieved in this manner, through the combination of the large continues contact surfaces and the reliable attachment of the structure to the chassis wall by means of the locking tabs being formed integral with the contact means. It will likewise be appreciated that by manufacturing the entire guide and support structure 1 as an integral unit from a thermally conductive material the structure 1 will serve as an effective heat sink, especially so in combination with the discussed large contact surfaces relative to the plug-in unit as well as relative to the chassis walls.

In applications where the guide and support units 1 are employed in air-cooled sub-racks or chassis 20, it is desirable that the chassis walls are as open as possible to allow the appropriate cooling-air flow. In such cases, cooling of the plug-in units will be further improved by the extremely slim design of the structure 1. Specifically, the slim design blocks fewer per-forations than the conventionally designed board guides, thereby permitting a larger un-interrupted flow of cooling-air through the chassis walls. This slim design is made possible by the described configuration of the structure 1 being manufactured as an integral unit from a metallic plate material.

The cooling-air flow is enhanced even further with the design of the described first embodiment having a base portion 5 being totally open between the free edges 7A, 8A of the side walls 7, 8. This open bottom aperture is indicated with the reference number 10 in FIG. 4A. With reference specifically to FIG. 4B, this means that cooling-air CA will enter the interior of the profile 1 through perforations 23 that would conventionally be blocked by the board guide structure. From the interior of the profile 1 this cooling-air CA will exit the profile through the first and second side wall apertures 11, 12, thereby assisting in removing heat from the mounted plug-in units 2. Experimental tests have been performed with an air-cooled sub-rack being fully equipped with plug-in units. Said tests have indicated that by employing guide and support structures 1 of the inventive design the pressure drop across the rack walls will be reduced to approximately 40% of the pressure drop resulting from the use of conventional board guides. This in turn means that the cooling-air flow through the rack will be increased by 10–30%, or alternatively that less powerful and therefore less expensive fans may be employed for a given application.

Figure 6:
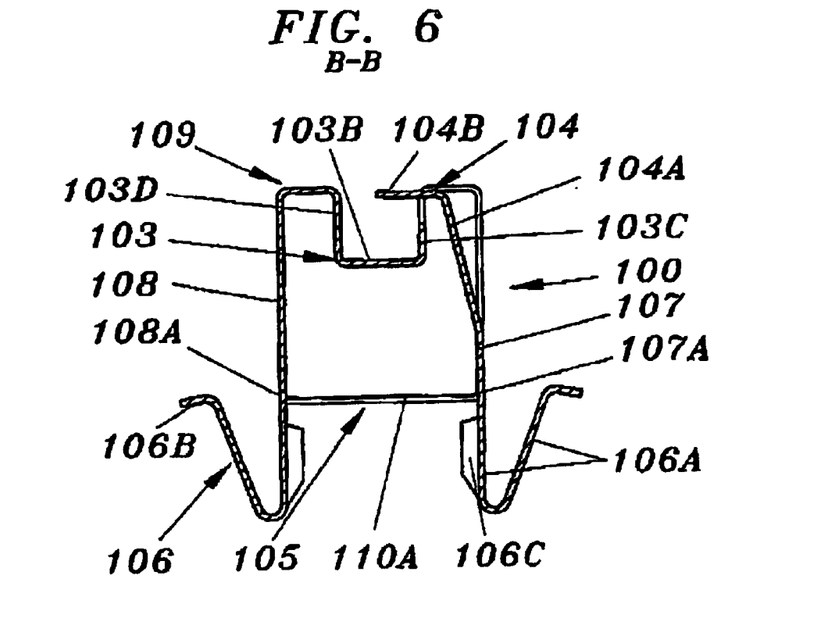
FIG. 6 is a cross section through a second embodiment of the guide and support structure according to the invention, taken along line B—B of FIG. 8.
Figure 7:
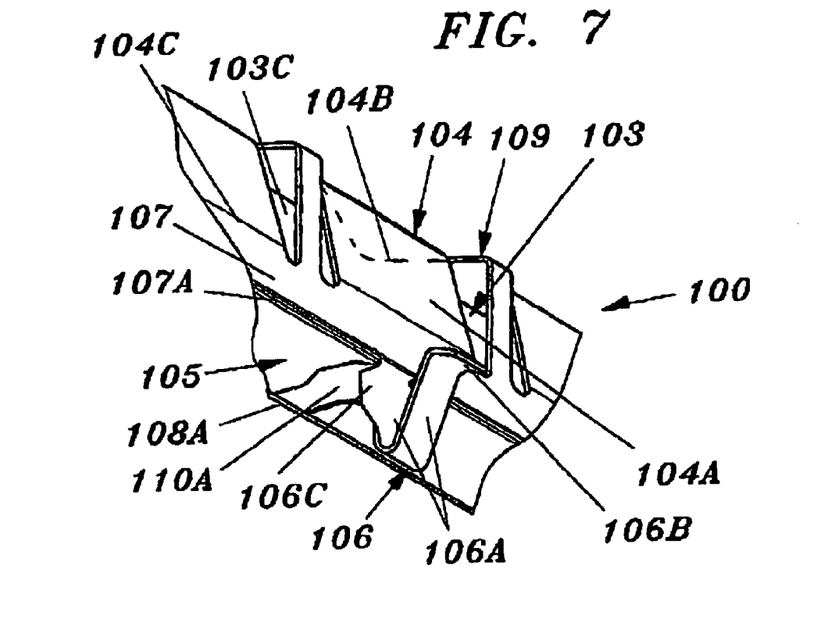
FIG. 7 is a partial bottom perspective view of the second embodiment of the guide and support structure illustrated in FIG. 6.
Figure 8:
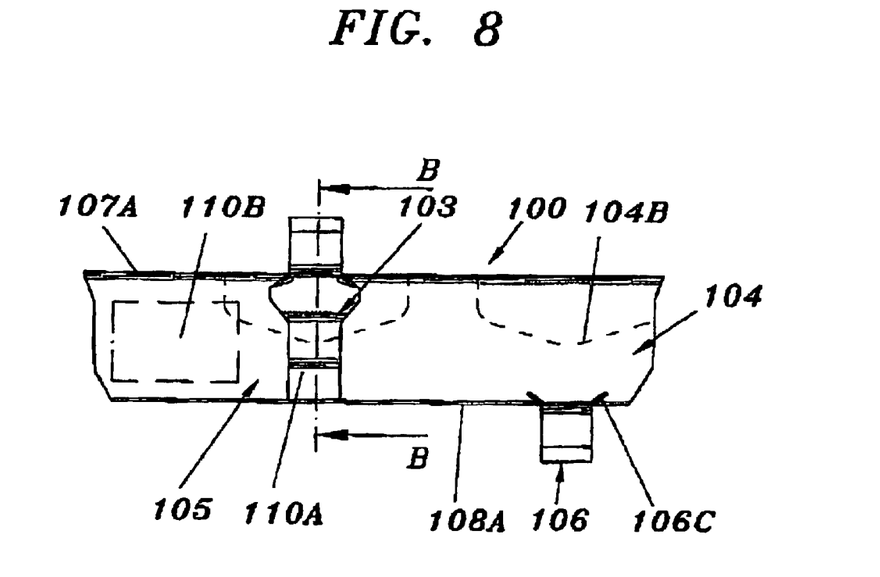
FIG. 8 is a bottom plan view of the second embodiment of the guide and support structure that is illustrated in FIGS. 6 and 7.

Drawing FIGS. 6–11 illustrate modified second and third embodiments of the inventive guide and support structure 100 and 200 respectively. Said embodiments are particularly suitable for applications that require a large contact surface between the structure and a chassis wall in order to promote electrical contact and/or conduction of heat. The second embodiment is illustrated in FIGS. 6–8 and mainly differs from the first embodiment by the provision of a bottom wall 105 forming the base of the structure 100. The bottom wall 105 extends between lower portions 107A, 108A of the side walls of the elongated profile 100. Specifically, in the illustrated embodiment the elongated profile 100 is likewise designed so that it may be punched out in one piece from a plate blank. Thus, the bottom wall 105 is formed integral with the first side wall 107 and is bent inwardly from the lower portion 107A thereof, towards the lower portion 108A of the second side wall 108.

In the illustrated embodiment the bottom wall 105 is continuos except for bottom apertures 110A that will be the result of forming the locking tabs 106 provided at the lower end 107A of the first side wall 107. Said locking tabs 106, with their main body 106A, support lug 106B and pawls 106C, are formed from the material of the bottom wall 105, whereas the locking tabs at the lower end 108A of the second side wall 108 are formed in the same manner as by the first embodiment. Furthermore the first and second side wall apertures of the first embodiment have been omitted, with the result that the second side wall 108 is connected to the web 109 and the guide channel 103 along the entire length of the profile 100, without any interruption. Also, the base 104A of the contact members 104 extends the full width of the contact member and is continuously connected to the contact portion 104B. Except for the described differences the structure 100 of the second embodiment is identical to that of the first embodiment and need not be described any further. However, it shall be emphasized that in applications requiring also an enhanced cooling-air flow, the guide and support structure 100 of the second embodiment may likewise be provided with side wall apertures like those of the first embodiment as well as with one or more additional bottom wall apertures 110B (indicated with dash-dot lines in FIG. 8).

Figure 9:
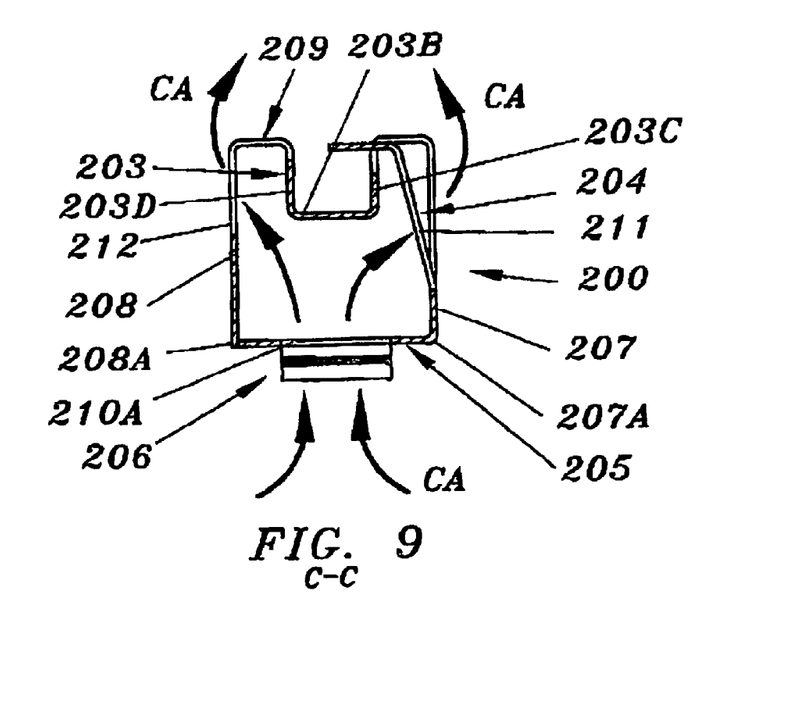
FIG. 9 is a cross section through a third embodiment of the guide and support structure according to the invention, taken along line C—C of FIG. 11.
Figure 10:
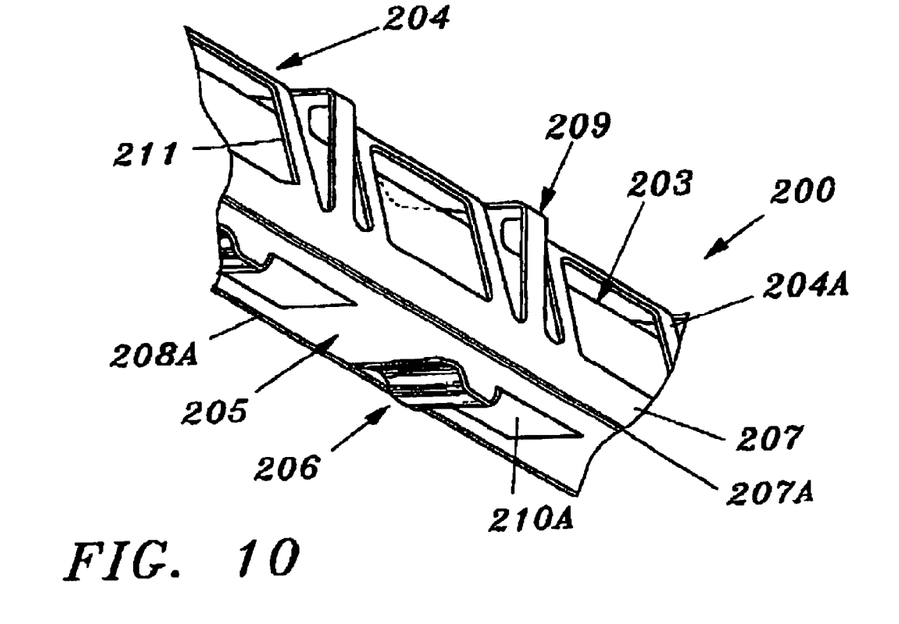
FIG. 10 is a partial bottom perspective view of the third embodiment of the guide and support structure illustrated in FIG. 9.
Figure 11:
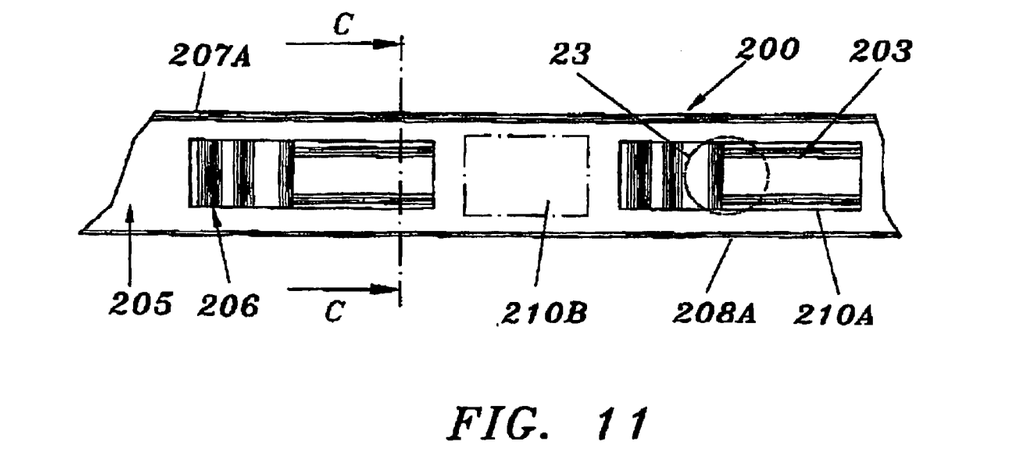
FIG. 11 is a bottom plan view of the third embodiment of the guide and support structure that is illustrated in FIGS. 9 and 10.

Drawing FIGS. 9–11 illustrate a third embodiment of the guide and support structure 200. In this embodiment, the upper portion of the elongated profile 200 is identical to that of the first embodiment, whereas a bottom wall 205 like in the second embodiment forms the base 205 of the profile. The main difference is that in the third embodiment the locking tabs are formed as gripping hooks 206 that are punched out from the bottom wall 205, leaving bottom apertures 210A. Where appropriate said bottom apertures might be supplemented by further bottom wall apertures 210B, as is outlined in FIG. 11. The gripping hooks 206 are formed approximately centrally in the bottom wall 205, with regard to the lower portions 207A, 208A of the side walls 207, 208, and are bent backwards toward the bottom wall 205 so as to be extended in the longitudinal direction of the profile 200. With this design, the structure 200 may be easily attached by positioning the free end of the hooks 206 in a perforation 23 and by then simply pushing the structure 200 forward in the direction of the hooks. Each hook 206 will then be extended through the associated perforation 23 to grip the chassis wall from the outside.

Throughout the drawing figures, identical or corresponding parts of the guide and support structures of the different embodiments are given the same basic reference numeral, but with the addition of 100 in the second embodiment and 200 in the third embodiment.

In further modified, but not specifically illustrated embodiments of the invention any of the illustrated guide and support structures may alternatively be provided with only one side wall aperture formed in either one of the walls of the profile. Such a design may be appropriate for specific applications requiring less than maximum cooling-air flow.

It will be understood by those skilled in the art that various modifications and changes may be made to the present invention without departure from the scope thereof, which is defined by the appended claims.

What is claimed is:

1. A guide and support structure forming a guide channel for slidably receiving an edge of a plug-in unit, such as a printed circuit card or electronic module, and having a base portion with means for supporting the structure against a chassis, mutually spaced but generally parallel side walls extending outwardly from the base portion and resilient contact members extending into the path of movement of a plug-in unit being inserted into the guide channel for making electrical contact with the plug-in unit, characterized by an upper web portion connecting outward ends of the side walls, in that the guide channel is formed in the upper web portion and in that the base portion is provided with at least one bottom aperture forming a path with minimum blockage for cooling air (CA) flow from outside the chassis, through perforated walls of the chassis and into the interior of the structure.

2. A guide and support structure according to claim 1, characterized in that the web portion, the side walls and the base portion with the means for supporting the structure is one integral unit formed of a metallic plate material having good electrical as well as thermal conductivity.

3. A guide and support structure according to claim 2, characterized in that the integral unit has the general form of an elongate plate profile and in that said base portion forms means for conducting heat from an inserted plug-in unit to said chassis.

4. A guide and support structure according to claim 1, characterized in that the base portion comprises means for fixing the structure to the chassis as well as means for establishing electrical contact with said chassis.

5. A guide and support structure according to claim 1, characterized in that the base portion (5) is formed by free edges of the side walls, said free edges being spaced from the upper web portion and forming said means for supporting the structure as well as means for establishing electrical contact with said chassis and means for conducting heat from an inserted plug-in unit to said chassis.

6. A guide and support structure according to claim 5, characterized in that the base of the elongate profile is completely open between the free edges of the side walls.

7. A guide and support structure according to claim 1, characterized in that at least one of the side walls, of the elongate profile is provided with side apertures forming a path for cooling air (CA) from the interior of the structure through said side wall and to the interior of the chassis.

8. A guide and support structure according to claim 7, characterized in that side apertures forming a path for cooling air (CA) are provided in both side walls, surrounding the guide channel.

9. A guide and support structure according to claim 1, characterized in that the guide channel that is formed in the upper web portion has a general U-shape with the open side of the guide channel facing away from the base portion of the elongate plate profile, in that the guide channel has a continuos bottom wall and continuous spaced channel walls (3C, 3D; 103C, 103D; 203C, 203D) and in that individual resilient contact members extend from one of the side walls of the elongate profile into the path of movement of an inserted plug-in unit.

10. A guide and support structure according to claim 9, characterized in that the individual resilient contact members are formed partly from the plate material of one of the side walls and partly from the plate material of the upper web portion.

11. A guide and support structure according to claim 9, characterized in that the side apertures in one of the side walls of the elongate profile are formed through a base portion of each individual contact member.

12. A guide and support structure according to claim 1, characterized in that the base portion is formed by a bottom wall extending between lower edge portions of the side walls, said bottom wall forming the means for supporting the structure as well as the means for establishing electrical contact with said chassis and means for conducting heat from an inserted plug-in unit to said chassis.

13. A guide and support structure according to claim 1, characterized by locking tabs protruding from the base portion, the locking tabs being adapted for insertion into perforations in a wall of the chassis and forming said means for fixing the guide and support structure to the chassis as well as means for establishing electrical contact with said chassis and means for conducting heat from an inserted plug-in unit to said chassis.

14. A guide and support structure according to claim 13, characterized in that the locking tabs have a general V-shape with a first end thereof being integral with and extending from the free edge or from the edge portion of a respective side wall and with a second free end thereof forming a support lug intended for engaging the inner surface of a wall of the chassis and in that the locking tabs adjacent said first end are provided with pawls intended for engaging the outer surface of a wall of the chassis, to thereby fix the guide and support structure to said chassis wall.

15. A guide and support structure according to claim 14, characterized in that the locking tabs are provided with two pawls being extended in mutually opposite directions from side edges of the main portions of the locking tabs.

16. A guide and support structure according to claim 13, characterized in that the locking tabs are distributed at equal distances from each other along each of the free edges or along each of the edge portions of the side walls and in that the locking tabs of one side wall are displaced with half a pitch in relation to the locking tabs of the other side wall.

17. A guide and support structure according to claim 1, characterized in that the elongate profile is manufactured from a stainless steel material that is tin plated.

* * * * *